United States Patent

Grayson et al.

[11] Patent Number: 5,995,816
[45] Date of Patent: Nov. 30, 1999

[54] FREQUENCY HOPPING COMMUNICATIONS RECEIVERS

[75] Inventors: Mark Grayson; Lionel Poisson, both of Imperial Way Reading, United Kingdom

[73] Assignee: NEC Corporation, Tokyo, Japan

[21] Appl. No.: 08/996,471

[22] Filed: Dec. 22, 1997

[51] Int. Cl.[6] .............................. H04B 1/06; H04L 27/08
[52] U.S. Cl. .................... 455/246.1; 455/232.1; 455/234.1; 455/239.1; 375/345
[58] Field of Search .............................. 455/250.1, 251.1, 455/254, 232.1, 234.1, 246.1, 239.1; 370/332, 333, 480, 344; 375/202, 345, 346, 347

[56] References Cited

U.S. PATENT DOCUMENTS

| | | | |
|---|---|---|---|
| 5,050,192 | 9/1991 | Nawata | 375/345 |
| 5,204,976 | 4/1993 | Baldwin et al. | 455/234.2 |
| 5,267,272 | 11/1993 | Cai et al. | 375/345 |
| 5,452,332 | 9/1995 | Otani et al. | 375/345 |
| 5,568,523 | 10/1996 | Tsujimoto | 375/347 |
| 5,646,963 | 7/1997 | Dent | 375/345 |

FOREIGN PATENT DOCUMENTS

| | | |
|---|---|---|
| 0366025 | 5/1990 | European Pat. Off. . |
| 2625387 | 6/1989 | France . |
| 2149245 | 6/1985 | United Kingdom . |

Primary Examiner—Dwayne D. Bost
Assistant Examiner—Raymond B. Persino
Attorney, Agent, or Firm—Sughrue, Mion, Zinn, Macpeak & Seas, PLLC

[57] ABSTRACT

In a frequency hopping communications receiver an automatic gain control process in which the mean signal strength of bursts of different frequencies and co-channel interference are detected, a weighted average based on the signal strength and co-channel interference is formed and the weighted average is used as a gain control signal.

3 Claims, 2 Drawing Sheets

FREQUENCY HOPPING COMMUNICATIONS RECEIVERS

FIELD OF THE INVENTION

This invention relates to frequency-hopping communications receivers such as GSM telephones.

BACKGROUND OF THE INVENTION

In the GSM system, each base station is assigned a group of transmitting frequencies for communication channels. The base station can switch at regular intervals between such transmitting frequencies in a predetermined sequence. Each mobile telephone in the service zone of a base station receives data from the base station to enable it to establish a pattern of frequency-hopping to receive data transmitted in its communication channel.

The mobile telephone receiver has several control loops which track, for example, timing, frequency and signal strength of the bursts and operate to ensure that the receiver remains in synchronism with the transmitter and to provide a usable signal to the following stages.

In the particular case of an automatic gain control loop, for example, changes in signal strength are a result of normal attenuation dependent on the distance between transmitter and receiver, shadow fading effects caused by a physical object blocking the direct path and Rayleigh fading caused by the receiver moving through multiple reflected signals. Shadow fading has a spacial correlation which may be assumed to be unity over many wavelengths. The Rayleigh fading, however, may be totally uncorrelated between bursts.

It is usual to exclude the effects of Rayleigh fading by averaging over a plurality of bursts.

A problem arises, however, if co-channel interference is present at one of the hopping frequencies. Such interference will make the signal strength at that frequency greater although the signals being received are, in fact, unwanted. Gain will be reduced for all frequencies.

SUMMARY OF THE INVENTION

Broadly, the object of the present invention is to provide an automatic gain control method for use in a frequency hopping receiver by means of which the effects of co-channel interference at one hopping frequency are at least significantly reduced.

In accordance with this aspect of the invention, a method of automatic gain control in a frequency hopping communications receiver comprises detecting the mean received signal strength of signal bursts received at each of a plurality of different frequencies, detecting the presence of co-channel interference, on any of the bursts, forming a weighted average of the mean received signal strengths with the weighting applied to each burst determined by the detection of co-channel interference on that burst, the weighting applied to a burst containing co-channel interference being reduced with respect to the weighting applied to other bursts and applying the weighted mean derived as a gain control signal.

Preferably, the. presence of co-channel interference in any burst is detected by comparing the mean received signal strength of that burst with the average of the mean received signal strengths of the other bursts.

The invention also has for its object to provide a receiver in which the effects of co-channel interference at one hopping frequency are at least significantly reduced.

In accordance with this aspect of the invention there is provided a frequency-hopping communications receiver including a radio frequency input stage capable of being tuned to a plurality of different centre-frequencies, a frequency hopping control controlling the tuning of the input stage so that it is tuned sequentially to a selected number of the centre frequencies, f1, f2, . . . fn in a cyclical manner, a mean received burst signal strength detecting means for generating a plurality of signal strength values M1, M2, . . . Mn representing the mean burst received signal strength at the respective centre frequencies f1, f2, . . . fn, gain control means for controlling the gain of the input stage in accordance a weighted mean.

$$(w1\ M1 + w2\ M2\ \ldots\ + wn\ Mn)/n$$

of the signal strength values where wi is the weighting of the ith burst signal strength value, comparing means for comparing the largest of the burst signal strength values with the average of the remaining n−1 signal strength values and weighting reduction means controlled by said comparing means for reducing the weighting of the largest of the signal strength values in the gain control means if such largest signal strength value exceeds the average of the remaining n−1 signal strength values by more than a predetermined amount.

With this arrangement, when there is co-channel interference on one frequency causing the mean signal strength value to be significantly increased, the weighting of the signal strength value for that frequency will be reduced to zero or some other reduced value, ensuring that the co-channel interference does not have an excessive effect on the gain control loop.

Preferably, the receiver includes other control loops for example a timing control loop, in which a control value is varied in accordance with parameter measurements at each frequency in use, and weightings of the parameter measurements in forming said control value and varied in accordance with the weightings w1 to wn obtained in the gain control loop, the effect of co-channel interference on such other loops is likewise reduced.

BRIEF DESCRIPTION OF THE DRAWING

In the accompanying drawings.

DETAILED DESCRIPTION OF THE DISCLOSURE

Figure 1:
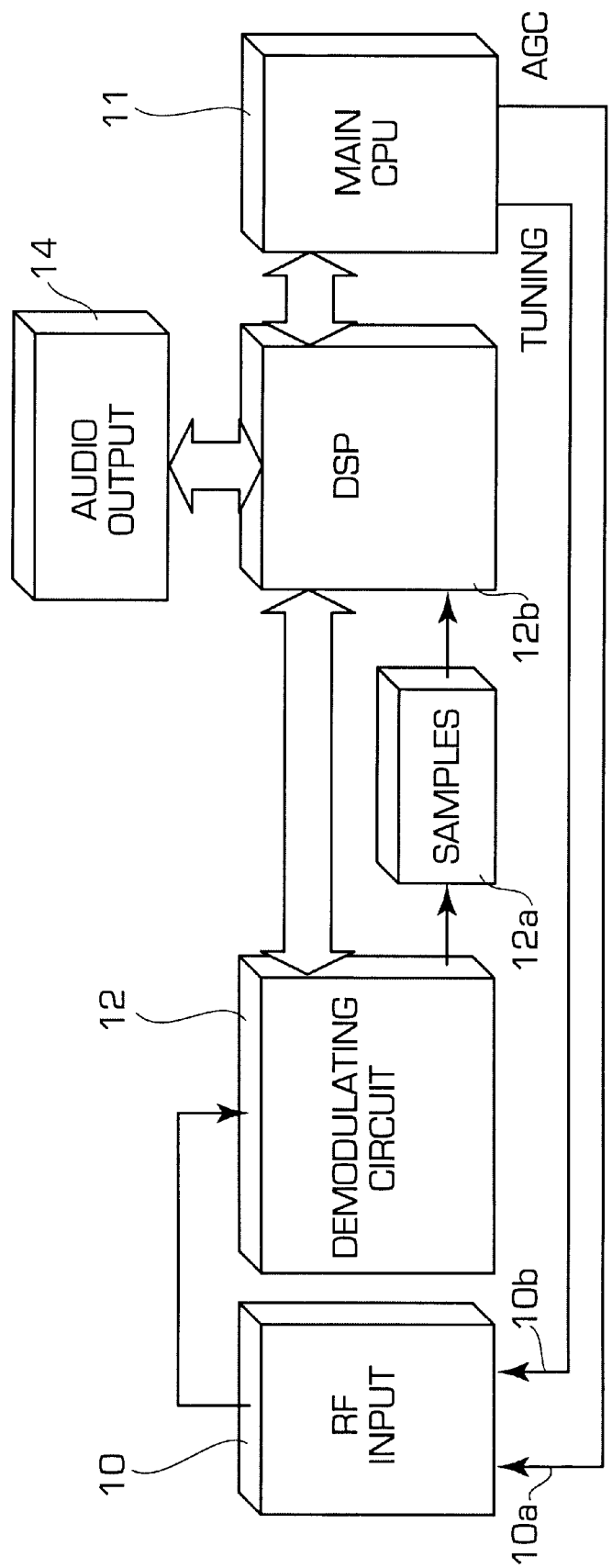
FIG. 1 is a simplified block diagram of a GSM phone in accordance with one example of the invention.

FIG. 1 shows an RF input stage 10 which has an automatic gain control (agc) input connection 10a which determines the gain of the input stage. The input stage also has a tuning signal input 10b which determines which one of a plurality of different centre frequencies the RF input stage is tuned to at any given instant. Both the agc operation and the tuning operation are controlled by a main CPU 11 which receives demodulated data from the input stage via a demodulating circuit 12 and a dedicated digital signal processor (dsp) 12b. The CPU determines from its received data what sequence of frequencies f1, f2, f3, . . . fn a nearby base-station is using for communication with the mobile phone and controls the tuning of the receivers in synchronism in a known manner not forming any part of the subject matter of the present application. Encoded audio data contained in the signal bursts received from the base station are decoded, converted to analog signals and passed by the dsp to the audio output stage 14 of the phone.

As is usual, a sampling circuit 12a associated with the demodulating circuit 12, samples the received signal strength periodically and passes the sample signals to the dsp where they are stored and demodulated. Typically 160 samples are stored for each frequency burst and the dsp is programmed to produce a mean received signal strength (MRSS) value M1, M2, M3, . . . Mn for each successive burst and pass this forward to the main CPU where, conventionally, all the MRSS values received in a frequency hopping cycle are processed to obtain a gain value which is passed via a digital interface to the agc input 10a of the RF input stage.

Figure 2:
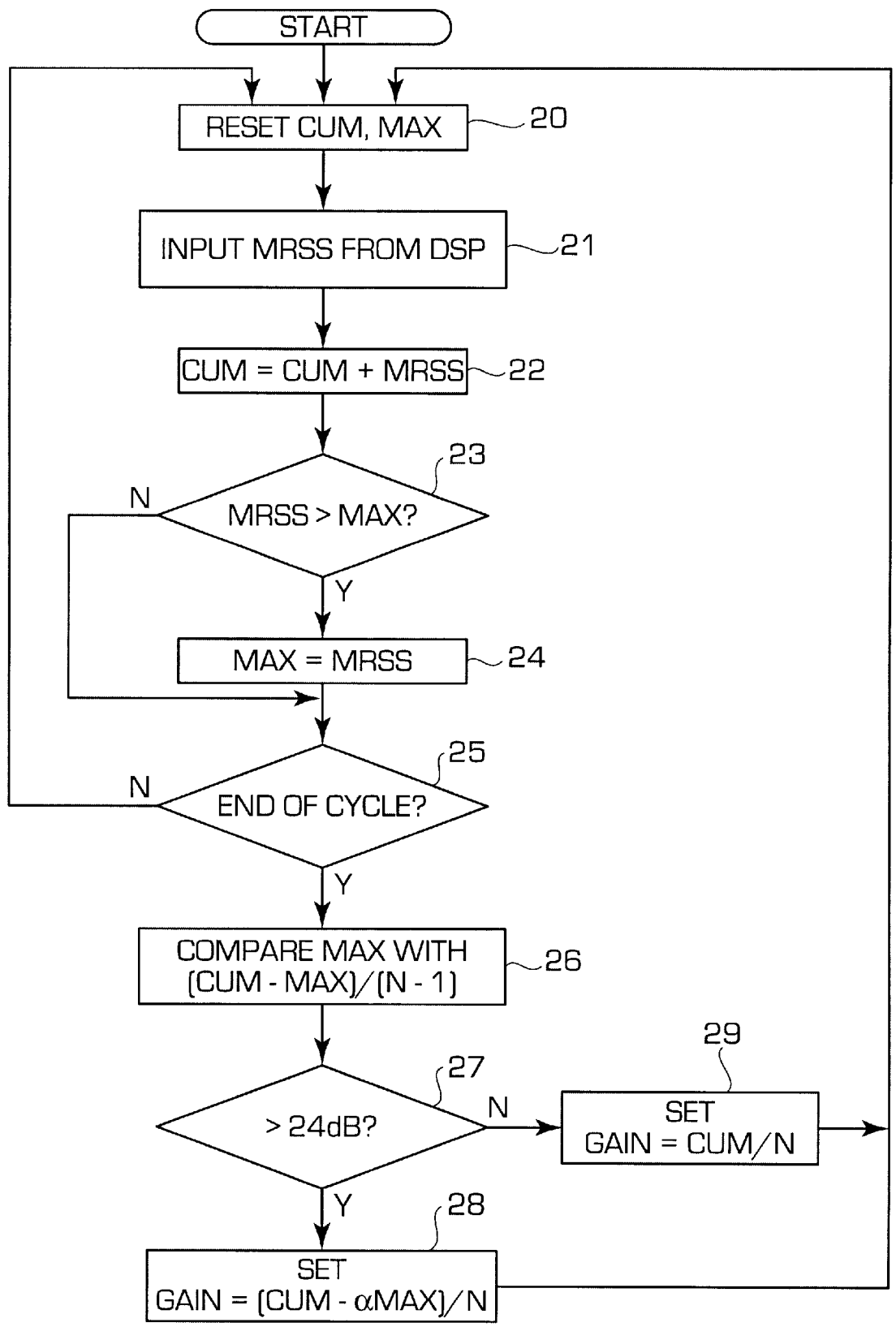
FIG. 2 is a flow chart showing the automatic gain control process used in the phone.

FIG. 2 is a flow chart showing how, in the example of the invention described herein, the gain value is obtained in each frequency hopping cycle.

At the beginning of each cycle, the values held in CUM and MAX variables are reset 20 to zero. In step 21 the latest MRSS value from the dsp is input and in step 22, the value of variable CUM is increased by the MRSS value. In step 23, the MRSS value is compared with the currently held value of MAX and if it is greater MAX is set to MRSS in step 24. If the cycle is incomplete (25) steps 20 to 24 are repeated, otherwise, the final value held in the MAX variable is compared (26) with a value representing the average of the MRSS values received in all the iterations of the loop except that in which the MAX value was received, by calculating the value of (CUM−MAX)/N−1 where N is the number of loops in each cycle i.e. the number of hopping frequencies in use. If the value of MAX exceeds this average value by more than a predetermined amount (27) (e.g. 24 dB) the gain value to be output by the CPU is set (28) to (CUM−αMAX)/N where α is less than or equal to unity. Otherwise the gain is set (29) to the average of all the MRSS values, i.e. CUM/N.

It will be understood that the step 28 or step 29 results in a gain value $$(w1\ M1 + w2\ M2\ \ldots\ +wn\ Mn)/N$$

which is a weighted mean of the signals M1 to Mn with the individual values of w1 to wn being set to unity for frequency burst on which there is no co-channel interference and to some reduced value for a frequency burst on which co-channel interference does exist. The reduced value can be zero (if the value of α is unity) or a value between zero and unity ($w_N = 1 - \alpha$)

Where there are other control loops active in the control of timing values and/or frequency values, these too may be controlled in accordance with the weighted value of corresponding measurements made during individual frequency bursts with the weightings determined in the AGC loop being used in the other loops to minimise the effects of co-channel interference on the proper operations of these other control loops. For example the weightings determined in agc loop for one cycle could be used in the following cycle for other control loops.

We claim:

1. An automatic gain control process for use in frequency hopping communications receiver which comprises:

(a) detecting the mean received signal strength of signal bursts received at each of a plurality of different frequencies;

(b) detecting the presence of co-channel interferences on any of these bursts;

(c) forming a weighted average of the mean received signal strengths with a weighting applied to each burst determined by the detection of co-channel interference on that burst, the weighting applied to a burst containing co-channel interference being reduced with respect to the weighting applied to other bursts; and (d) applying the weighted mean so derived as a gain control signal.

2. An automatic gain control process as claimed in claim 1 in which step (b) comprises comparing the mean received signal strength in a candidate burst with the average of the mean received signal strengths in the other bursts and determining that co-channel interference exists if the mean received signal strength of the candidate burst exceeds the average received signal strength by more than a predetermined amount.

3. A frequency hopping communications receiver including a radio frequency input stage capable of being tuned to a plurality of different centre-frequencies, a frequency hopping control controlling the timing of the input stage so that it is tuned sequentially to a selected number of the centre frequencies, f1, f2, . . . fn in a cyclical manner, a mean received burst signal strength detecting means for generating a plurality of signal strength values M1, M2, . . . Mn representing the mean burst received signal strength at the respective centre frequencies f1, f2, . . . fn, gain control means for controlling the gain of the input stage in accordance a weighted mean $$(w1\ M1 + w2\ M2\ \ldots\ +wn\ Mn)/n$$

of the signal strength values where wi is the weighting of the ith signal strength value, comparing means for comparing the largest of the burst signal strength values with the average of the remaining n−1 signal strength values and weighting reduction means controlled by said comparing means for reducing the weighting of the largest of the signal strength values in the gain control means if such largest signal strength value exceeds the average of the remaining n−1 signal strength values by more than a predetermined amount.

* * * * *